(12) United States Patent
Lim (10) Patent No.: US 11,824,394 B2
(45) Date of Patent: Nov. 21, 2023

(54) BATTERY MANAGEMENT DEVICE, BATTERY MANAGEMENT METHOD, AND BATTERY PACK (71) Applicant: LG CHEM, LTD., Seoul (KR)

(72) Inventor: Bo-Mi Lim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 532 days.

(21) Appl. No.: 16/973,559

(22) PCT Filed: Jan. 10, 2020

(86) PCT No.: PCT/KR2020/000480
§ 371 (c)(1),
(2) Date: Dec. 9, 2020

(87) PCT Pub. No.: WO2020/153637
PCT Pub. Date: Jul. 30, 2020

(65) Prior Publication Data
US 2021/0249885 A1 Aug. 12, 2021

(30) Foreign Application Priority Data
Jan. 23, 2019 (KR) .................. 10-2019-0008921

(51) Int. Cl.
H02J 7/00 (2006.01)
G01R 31/367 (2019.01)
(Continued)

(52) U.S. Cl.
CPC ...... H02J 7/007182 (2020.01); G01R 31/367 (2019.01); G01R 31/382 (2019.01);
(Continued)

(58) Field of Classification Search
CPC .. H02J 7/0048; H02J 7/0068; H02J 7/007182; G01R 31/367; G01R 31/382
See application file for complete search history.

(56) References Cited

U.S. PATENT DOCUMENTS

2006/0111854 A1    5/2006   Plett
2006/0111870 A1    5/2006   Plett
(Continued)

FOREIGN PATENT DOCUMENTS

CN    105637376 A    6/2016
CN    106324508 A    1/2017
(Continued)

OTHER PUBLICATIONS

Extended European Search Report issued from the European Patent Office dated Nov. 12, 2021 in corresponding European patent application No. 20745016.4.
(Continued)

Primary Examiner — David V Henze-Gongola
(74) Attorney, Agent, or Firm — Morgan, Lewis & Bockius LLP (57) ABSTRACT There are provided a battery management apparatus, a battery management method and a battery pack. The battery management apparatus generates a first data set including a first current value, a first voltage value and a first temperature value indicating a current, a voltage and a temperature of a battery. The battery management apparatus generates a second data set from the first data set using an error generator. The battery management apparatus determines a first candidate value, a second candidate value and a third candidate value for a state of charge (SOC) respectively from the first current value, the first data set and the second data set. The control unit updates a correction value when a second difference value between the first candidate value and the third candidate value is smaller than a first difference
(Continued)

value between the first candidate value and the second candidate value.

20 Claims, 7 Drawing Sheets (51) Int. Cl.
 G01R 31/382 (2019.01)
 H01M 10/48 (2006.01)
(52) U.S. Cl.
 CPC .......... *H01M 10/48* (2013.01); *H02J 7/0048* (2020.01); *H02J 7/0068* (2013.01)

(56) References Cited

U.S. PATENT DOCUMENTS

| | | | |
|---|---|---|---|
| 2010/0280777 A1 | 11/2010 | Jin et al. | |
| 2016/0139210 A1 | 5/2016 | Coenen | |
| 2017/0141589 A1* | 5/2017 | Inoue | H02J 7/00 |
| 2017/0199247 A1 | 7/2017 | Joe | |
| 2017/0244137 A1* | 8/2017 | Guo | G01R 31/389 |
| 2018/0088181 A1 | 3/2018 | Jiang et al. | |
| 2018/0111599 A1 | 4/2018 | Wang et al. | |
| 2018/0203071 A1 | 7/2018 | Takemura et al. | |
| 2019/0094305 A1 | 3/2019 | Takechi | |
| 2020/0003844 A1 | 1/2020 | Lim et al. | |

FOREIGN PATENT DOCUMENTS

| | | |
|---|---|---|
| DE | 112016006166 T5 | 9/2018 |
| JP | 2017-122622 A | 7/2017 |
| JP | 2017-194284 A | 10/2017 |
| JP | 6351852 B2 | 7/2018 |
| KR | 10-2009-0077657 A | 7/2009 |
| KR | 10-0916510 B1 | 9/2009 |
| KR | 10-2013-0110355 A | 10/2013 |
| KR | 10-1442842 B1 | 9/2014 |
| KR | 10-1529515 B1 | 6/2015 |
| KR | 10-1767635 B1 | 8/2017 |
| KR | 10-2018-0058057 A | 5/2018 |
| KR | 10-2018-0095207 A | 8/2018 |
| KR | 10-1908412 B1 | 10/2018 |

OTHER PUBLICATIONS

Office Action dated Feb. 6, 2023, issued in corresponding Chinese Patent Application No. 202080002980.2.
International Search Report issued in corresponding International Patent Application No. PCT/KR2020/000480, dated Apr. 21, 2020.

* cited by examiner

BATTERY MANAGEMENT DEVICE, BATTERY MANAGEMENT METHOD, AND BATTERY PACK

TECHNICAL FIELD

The present disclosure relates to battery state of charge (SOC) estimation.

The present application claims priority to Korean Patent Application No. 10-2019-0008921 filed in the Republic of Korea on Jan. 23, 2019, the disclosure of which is incorporated herein by reference.

BACKGROUND ART

Recently, there has been dramatically growing demand for portable electronic products such as laptop computers, video cameras and mobile phones, and with the extensive development of electric vehicles, accumulators for energy storage, robots and satellites, many studies are being made on batteries that can be recharged repeatedly.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages that recharging can be done whenever it is convenient, the self-discharge rate is very low and the energy density is high.

One of important parameters required to control the charge/discharge of a battery is State of Charge (SOC). The SOC is a parameter indicating a relative ratio of the remaining capacity to the maximum capacity indicating electrical energy stored in the battery when the battery is fully charged, and may be expressed as 0-1 or 0%-100%. For example, when the maximum capacity of the battery is 1000 Ah (ampere-hour) and the remaining capacity of the battery is 750 Ah, the SOC of the battery is 0.75 (or 75%).

Ampere counting and an equivalent circuit model are typically used to estimate the SOC of the battery. According to ampere counting, the SOC of the battery is estimated based on a cumulative current value corresponding to the current flowing through the battery accumulated over time. However, due to a measurement error of a current sensor and/or external noise, there may be a discrepancy between the SOC estimated by ampere counting and the actual SOC. The equivalent circuit model is designed to simulate the electrochemical properties of the battery. However, the battery has the nonlinear feature according to the operational state, and it is very difficult to design the equivalent circuit model for perfectly simulating the nonlinear feature of the battery.

To overcome the above-described drawbacks of each of the ampere counting and the equivalent circuit model, battery SOC estimation using the extended Kalman filter has been suggested. The extended Kalman filter using the ampere counting with the equivalent circuit model in combination achieves more accurate SOC estimation than when the ampere counting or the equivalent circuit model is used alone.

To estimate the SOC of the battery using the extended Kalman filter, it is necessary to determine the time constant of a resistor-capacitor (RC) pair included in the equivalent circuit model and set two process noise each associated with at least one state variable (e.g., SOC, overpotential).

However, since the time constant relies on only at least one of SOC and temperature of the battery and fixed values are allocated to each process noise, it is difficult to adjust the reliability of each of the ampere counting and the equivalent circuit model appropriately for the operational state of the battery and environment in which the battery is used.

DISCLOSURE

Technical Problem

The present disclosure is designed to solve the above-described problem, and therefore the present disclosure is directed to providing a battery management apparatus, a battery management method and a battery pack, in which a plurality of candidate values for the state of charge (SOC) of the battery is determined in each cycle, and the SOC of the battery is determined based on the relationship between the plurality of candidate values.

The present disclosure is further directed to providing a battery management apparatus, a battery management method and a battery pack, in which reliability of each of the ampere counting and the equivalent circuit model in the extended Kalman filter is adjusted based on the relationship between the plurality of candidate values.

These and other objects and advantages of the present disclosure may be understood by the following description and will be apparent from the embodiments of the present disclosure. In addition, it will be readily understood that the objects and advantages of the present disclosure may be realized by the means set forth in the appended claims and a combination thereof.

Technical Solution

A battery management apparatus according to an aspect of the present disclosure includes a sensing unit configured to detect a current, a voltage and a temperature of a battery, and a control unit. The control unit is configured to generate a first data set including a first current value indicating the detected current, a first voltage value indicating the detected voltage and a first temperature value indicating the detected temperature. The control unit is configured to generate a second data set including a second current value, a second voltage value and a second temperature value from the first data set using an error generator. The control unit is configured to determine a first time constant of an equivalent circuit model of an extended Kalman filter based on the first temperature value and a state of charge (SOC) in a previous cycle. The control unit is configured to determine a second time constant of the equivalent circuit model based on the second temperature value and the SOC in the previous cycle. The control unit is configured to determine a first candidate value for the SOC of the battery based on the first current value using ampere counting. The control unit is configured to determine a second candidate value for the SOC based on the first data set, the first time constant and a correction value using the extended Kalman filter. The control unit is configured to determine a third candidate value for the SOC based on the second data set, the second time constant and the correction value using the extended Kalman filter. The control unit is configured to determine a first difference value between the first candidate value and the second candidate value. The control unit is configured to determine a second difference value between the first candidate value and the third candidate value. The control unit is configured to update the correction value when the second difference value is smaller than the first difference value. The updated correction value is larger than a predetermined initial value.

The two values included in each of at least one of a first pair of the first current value and the second current value, a second pair of the first voltage value and the second voltage value and a third pair of the first temperature value and the second temperature value are different from each other.

A difference between the updated correction value and the initial value may be proportional to the first difference value.

The difference between the updated correction value and the initial value may be proportional to a difference between the first difference value and the second difference value.

The control unit may be configured to update the correction value using the following equation:

$$E_{correct} = \frac{M_1(D_1 - D_2) + M_2 D_1}{M_1 + M_2}$$

$D_1$ may denote the first difference value, $D_2$ may denote the second difference value, $M_1$ may denote a first weight, $M_2$ denotes a second weight, and $E_{correct}$ denote the updated correction value.

The control unit may be configured to update the correction value to be equal to the initial value, when the second difference value is equal to or larger than the first difference value.

The control unit may be configured to determine the first candidate value as the SOC, when the first difference value is larger than a threshold value.

The control unit may be configured to determine the second candidate value as the SOC, when the first difference value is equal to or smaller than the threshold value.

The control unit may be configured to selectively output a switching signal for controlling a switch installed on a current path of the battery. The control unit may be configured to regulate a duty cycle of the switching signal below a reference duty cycle, when the second difference value is smaller than the first difference value.

A battery pack according to another aspect of the present disclosure includes the battery management apparatus.

A battery management method according to still another aspect of the present disclosure includes detecting a current, a voltage and a temperature of a battery, generating a first data set including a first current value indicating the detected current, a first voltage value indicating the detected voltage and a first temperature value indicating the detected temperature, generating a second data set including a second current value, a second voltage value and a second temperature value from the first data set using an error generator, determining a first time constant of an equivalent circuit model of an extended Kalman filter based on the first temperature value and an SOC in a previous cycle, determining a second time constant of the equivalent circuit model based on the second temperature value and the SOC in the previous cycle, determining a first candidate value for the SOC of the battery based on the first current value using ampere counting, determining a second candidate value for the SOC based on the first data set, the first time constant and a correction value using the extended Kalman filter, determining a third candidate value for the SOC based on the second data set, the first time constant and the correction value using the extended Kalman filter, determining a first difference value between the first candidate value and the second candidate value, determining a second difference value between the first candidate value and the third candidate value, and updating the correction value when the second difference value is smaller than the first difference value. The updated correction value is larger than a predetermined initial value.

A difference between the updated correction value and the initial value may be proportional to the first difference value or a difference between the first difference value and the second difference value.

The battery management method may further include determining the first candidate value as the SOC, when the first difference value is larger than a threshold value, and determining the second candidate value as the SOC, when the first difference value is equal to or smaller than the threshold value.

Advantageous Effects

According to at least one of the embodiments of the present disclosure, it is possible to determine the state of charge (SOC) of the battery more accurately based on the relationship between a plurality of candidate values determined for the SOC of the battery in each cycle.

In addition, according to at least one of the embodiments of the present disclosure, it is possible to adjust the reliability of each of the ampere counting and the equivalent circuit model in the extended Kalman filter based on the relationship between the plurality of candidate values.

The effects of the present disclosure are not limited to the effects mentioned above, and these and other effects will be clearly understood by those skilled in the art from the appended claims.

BEST MODE

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but rather interpreted based on the meanings and concepts corresponding to the technical aspects of the present disclosure on the basis of the principle that the inventor is allowed to define the terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could have been made thereto at the time that the application was filed.

The terms including the ordinal number such as "first", "second" and the like, are used to distinguish one element from another among various elements, but not intended to limit the elements by the terms.

Unless the context clearly indicates otherwise, it will be understood that the term "comprises" when used in this specification, specifies the presence of stated elements, but does not preclude the presence or addition of one or more other elements. Additionally, the term <control unit> as used herein refers to a processing unit of at least one function or operation, and this may be implemented by either hardware or software or a combination of hardware and software.

In addition, throughout the specification, it will be further understood that when an element is referred to as being "connected to" another element, it can be directly connected to the other element or intervening elements may be present.

Figure 1:
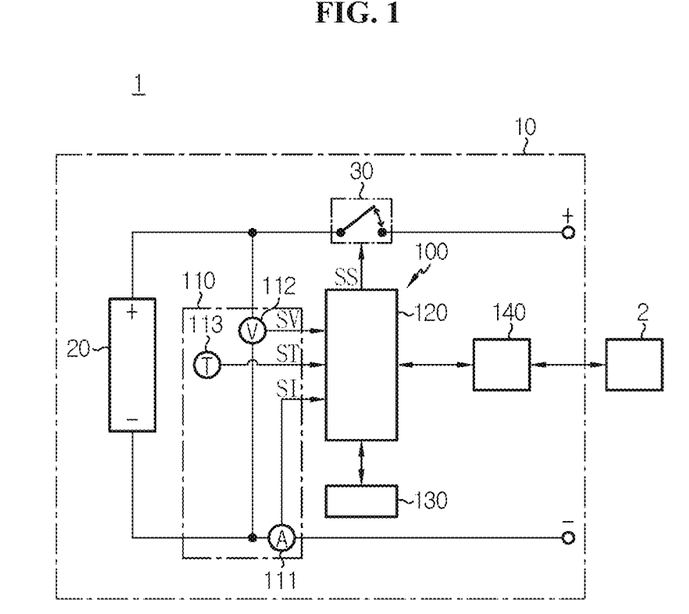
FIG. 1 is an exemplary diagram of a configuration of a battery pack according to the present disclosure.
Figure 2:
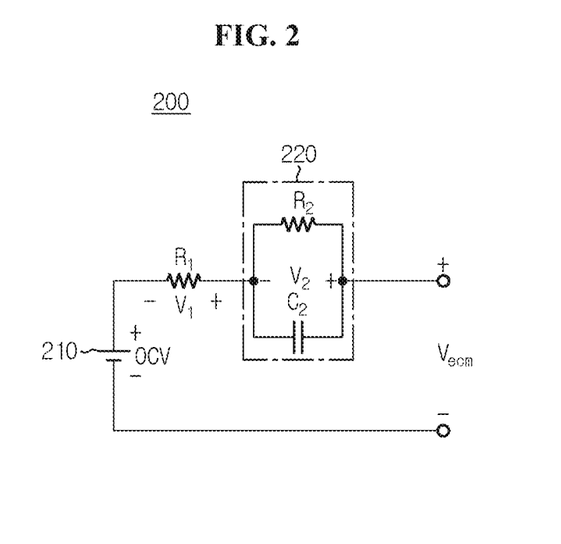
FIG. 2 is an exemplary diagram of a circuit configuration of an equivalent circuit model of a battery.
Figure 3:
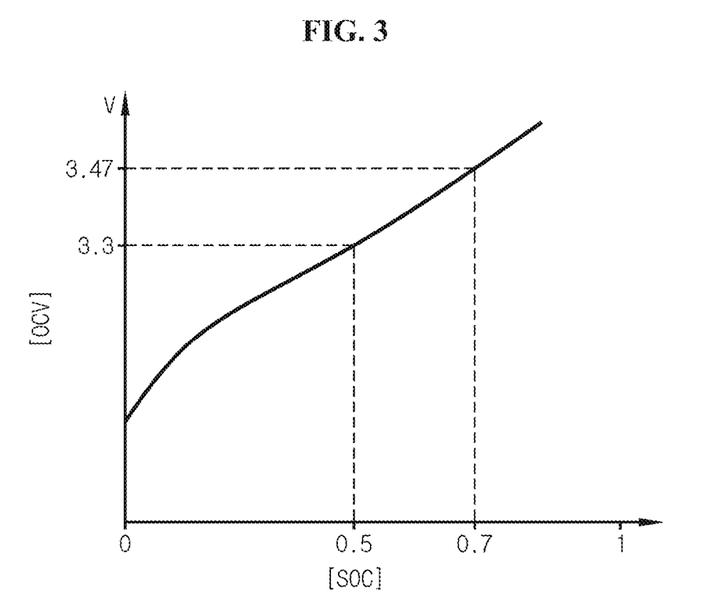
FIG. 3 is an exemplary diagram of an open circuit voltage (OCV)-state of charge (SOC) curve of a battery.

FIG. 1 is an exemplary diagram of a configuration of a battery pack according to an embodiment of the present disclosure, FIG. 2 is an exemplary diagram of a circuit configuration of an equivalent circuit model of a battery, and FIG. 3 is an exemplary diagram of an open circuit voltage (OCV)-state of charge (SOC) curve of the battery.

Referring to FIG. 1, the battery pack 10 is configured to supply electrical energy required for an electricity powered device such as an electric vehicle 1, and includes a battery 20, a switch 30 and a battery management apparatus 100.

The battery 20 includes at least one battery cell. Each battery cell may be, for example, a lithium ion cell. Of course, the type of the battery cell is not limited to the lithium ion cell, and may include, without limitation, any type that can be recharged repeatedly. Each battery cell included in the battery 20 is electrically connected to other battery cell in series or in parallel.

The switch 30 is installed on a current path for charging and discharging the battery 20. A control terminal of the switch 30 is provided to be electrically connected to a control unit 120. The switch 30 is controlled to be turned on and off according to the duty cycle of a switching signal SS outputted by the control unit 120, in response to the switching signal SS being applied to the control terminal. When the switching signal SS is high-level, the switch 30 may be turned on, and when the switching signal SS is low-level, the switch 30 may be turned off.

The battery management apparatus 100 is provided to be electrically connected to the battery 20 to periodically determine the SOC of the battery 20. The battery management apparatus 100 includes a sensing unit 110, the control unit 120, a memory unit 130 and a communication unit 140.

The sensing unit 110 is configured to detect the voltage, current and temperature of the battery 20. The sensing unit 110 includes a current sensor 111, a voltage sensor 112 and a temperature sensor 113.

The current sensor 111 is provided to be electrically connected to the charge/discharge path of the battery 20. The current sensor 111 is configured to detect the current flowing through the battery 20, and output a signal SI indicating the detected current to the control unit 120.

The voltage sensor 112 is provided to be electrically connected to positive and negative terminals of the battery 20. The voltage sensor 112 is configured to detect the voltage across the positive and negative terminals of the battery 20, and output a signal SV indicating the detected voltage to the control unit 120.

The temperature sensor 113 is configured to detect the temperature of an area within a predetermined distance from the battery 20, and output a signal ST indicating the detected temperature to the control unit 120.

The control unit 120 is operably coupled to the sensing unit 110, the memory unit 130, the communication unit 140 and the switch 30. The control unit 120 may be implemented in hardware using at least one of application specific integrated circuits (ASICs), digital signal processors (DSPs), digital signal processing devices (DSPDs), programmable logic devices (PLDs), field programmable gate arrays (FPGAs), microprocessors and electrical units for performing other functions.

The control unit 120 is configured to periodically receive the signal SI, the signal SV and the signal ST outputted by the sensing unit 110. The control unit 120 is configured to determine a first current value, a first voltage value and a first temperature value from the signal SI, the signal SV and the signal ST respectively using an analog-to-digital converter (ADC) included in the control unit 120, and store a first data set including the first current value, the first voltage value and the first temperature value in the memory unit 130.

The memory unit 130 is operably coupled to the control unit 120. The memory unit 130 may store programs and data necessary to perform the steps described below. The memory unit 130 may include, for example, at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) and programmable read-only memory (PROM).

The communication unit 140 may be coupled to communicate with an external device 2 such as an Electronic Control Unit (ECU) of the electric vehicle 1. The communication unit 140 may receive a command message from the external device 2, and provide the received command message to the control unit 120. The command message may be a message requesting the activation of a specific function (e.g., SOC estimation, control of ON/OFF of the switch 30) of the battery management apparatus 100. The communication unit 140 may send a notification message from the control unit 120 to the external device 2. The notification message may be a message for notifying the result (e.g., the estimated SOC) of the function performed by the control unit 120 to the external device 2. For example, the communication unit 140 may communicate with the external device 2 via a wired network such as a local area network (LAN), a controller area network (CAN) and a daisy chain and/or a short range wireless network, for example, Bluetooth, Zigbee and WiFi.

The control unit 120 is configured to determine the state of health (SOH) or the maximum capacity of the battery 20. The maximum capacity indicates the maximum amount of charges that can be currently stored in the battery 20, and may be referred to as 'full charge capacity'. That is, the maximum capacity is equal to the cumulative value of currents flowing during discharging of the battery 20 at SOC of 1 (=100%) until the SOC is 0 (=0%). In an example, the control unit 120 may calculate the internal resistance of the battery 20, and determine the SOH or the maximum capacity of the battery 20 based on a difference between the calculated internal resistance and the reference resistance. In another example, the control unit 120 may determine the SOH or the maximum capacity of the battery 20, based on the SOC at each of different time points at which the battery 20 is charged and discharged and the cumulative current value for a period of time between the two time points, using the following Equation 1. Assume that the earlier time point of the two time points is $t_1$, and the later time point is $t_2$.

$$SOH_{new} = \frac{\int_{t_1}^{t_2} i_t dt}{Q_{ref}} = \frac{\Delta C}{Q_{ref}} = \frac{Q_{est}}{Q_{ref}} \quad \langle \text{Equation 1} \rangle$$

In Equation 1, $Q_{ref}$ denotes reference capacity, $SOC_1$ denotes SOC estimated at the time point $t_1$, $SOC_2$ denotes SOC estimated at the time point $t_2$, $\Delta SOC$ denotes a difference between $SOC_1$ and $SOC_2$, $i_t$ denotes a current value indicating the current detected at a time point t between the time point $t_1$ and the time point $t_2$, $\Delta C$ denotes the cumulative current value for a period of time from the time point $t_1$ to the time point $t_2$, $Q_{est}$ denotes an estimate of maximum capacity at the time point $t_2$, and $SOH_{new}$ denotes an estimate of SOH at the time point $t_2$. $Q_{ref}$ is a preset value indicating the maximum capacity when the SOH of the battery 20 is 1, and may be pre-stored in the memory unit 130.

In relation to Equation 1, when $\Delta SOC$ is too small, $Q_{est}$ may be greatly different from the actual one. Accordingly, the control unit 120 may be configured to determine the SOH or the maximum capacity of the battery 20 using Equation 1 only when $\Delta SOC$ is equal to or larger than a predetermined value (e.g., 0.5).

Hereinafter, the operation for estimating the SOC of the battery 20, performed by the control unit 120, will be described in more detail.

The control unit 120 determines a first candidate value based on the first current value using ampere counting. The first candidate value indicates an estimate of SOC of the battery 20 in the current cycle. The following Equation 2 may be used to determine the first candidate value.

$$SOC[k+1] = SOC_e[k] + \frac{i[k+1]\Delta t}{Q_{est}} \quad \langle \text{Equation 2} \rangle$$

Below is the description of the symbols used in Equation 2. $\Delta t$ denotes the time length per cycle. k is a time index that increases by 1 each time $\Delta t$ passes away, and indicates the number of cycles from the time point at which a predetermined event occurred to the current time point. The event may be, for example, a starting event of the charging and discharging of the battery 20 of which voltage is stabilized. The battery 20 of which voltage is stabilized may be the battery 20 on no-load condition in which the current does not flow through the battery 20 and the voltage of the battery 20 is uniformly maintained. In this case, $SOC_e[0]$ may be determined from an OCV-SOC curve defining a correspondence relationship between OCV and SOC of the battery 20 using the OCV of the battery 20 at the time point when the event occurred as an index. The OCV-SOC curve is stored in the memory unit 130.

In Equation 2, $\tau[k+1]$ denotes the current detected in the current cycle, and $SOC_e[k]$ denotes the SOC determined in the previous cycle by the ampere counting or the extended Kalman filter. $SOC[k+1]$ is the first candidate value, and indicates the SOC determined using Equation 2. In Equation 2, $\tau[k+1]$ may be replaced with $\tau[k]$.

The control unit 120 further determines a second candidate value and a third candidate value using the extended Kalman filter. The second candidate value indicates an estimate of SOC of the battery 20 in the current cycle. Prior to the description of the second candidate value and the third candidate value, the extended Kalman filter will be described.

The extended Kalman filter is an algorithm for periodically updating the SOC of the battery 20, by additionally using the equivalent circuit model 200 of the battery 20 together with the ampere counting represented by Equation 2.

Referring to FIG. 2, the equivalent circuit model 200 includes an OCV source 210, an ohm resistor $R_1$ and a resistor-capacitor (RC) pair 220.

The OCV source 210 simulates the OCV that is the voltage between the positive and negative electrodes of the battery 20 electrochemically stabilized for a long term. The OCV outputted by the OCV source 210 is in a nonlinear functional relationship with the SOC of the battery 20. That is, $OCV=f_1(SOC)$, $SOC=f_2(OCV)$, and $f_1$ and $f_2$ are inverse functions of each other. For example, referring to FIG. 3, 3.3 V=$f_1$(0.5), and 0.7=$f_2$(3.47 V).

The OCV outputted by the OCV source 210 may be preset by SOC and temperature through experimentation.

The ohm resistor $R_1$ is associated with IR drop $V_1$ of the battery 20. The IR drop refers to an instantaneous change in voltage across the battery 20 when the battery 20 is switched from the no-load condition to the charging/discharging condition or from the charging/discharging condition to the no-load condition. In an example, the voltage of the battery 20 measured at the time point when the battery 20 on no-load condition starts charging is higher than the OCV. In another example, the voltage of the battery 20 measured at the time point when the battery 20 on no-load condition starts discharging is lower than the OCV. The resistance value of the ohm resistor $R_1$ may be also preset by SOC and temperature through experimentation.

The RC pair 220 outputs overpotential (also known as 'polarization voltage') $V_2$ induced by an electric double layer of the battery 20 or etc., and includes a resistor $R_2$ and a capacitor $C_2$ connected in parallel. The overpotential $V_2$ may be referred to as 'polarization voltage'. The time constant of the RC pair 220 is the multiplication of the resistance value of the resistor $R_2$ by the capacitance of the capacitor $C_2$, and may be preset by SOC and temperature through experimentation.

$V_{ecm}$ is an output voltage of the equivalent circuit model 200, and equals the sum of the OCV from the OCV source 210, the IR drop $V_1$ across the ohm resistor $R_1$ and the overpotential $V_2$ across the RC pair 220.

As the time constant of the RC pair 220 is smaller, the current sensitivity of the equivalent circuit model 200 to the current flowing through the battery 20 is higher. On the contrary, as the time constant of the RC pair 220 is larger, the current sensitivity of the equivalent circuit model 200 to the current flowing through the battery 20 is lower. In the same condition, as the current sensitivity of the equivalent circuit model 200 is higher, $V_{ecm}$ changes faster. On the contrary, as the current sensitivity of the equivalent circuit model 200 is lower, $V_{ecm}$ changes more slowly.

In the equivalent circuit model 200, the overpotential in the current cycle may be defined as the following Equation 3.

$$V_2[k+1] = V_2[k]e^{-\frac{\Delta t}{\tau[k+1]}} + R_2[k+1]i[k+1]\left(1 - e^{-\frac{\Delta t}{\tau[k+1]}}\right) \quad \langle \text{Equation 3} \rangle$$

In Equation 3, $R_2[k+1]$ denotes the resistance value of the resistor $R_2$ in the current cycle, $\tau[k+1]$ denotes the time constant of the RC pair 220 in the current cycle, $V_2[k]$ denotes the overpotential in the previous cycle, and $V_2[k+1]$ denotes the overpotential in the current cycle. In Equation 3, τ[k+1] may be replaced with τ[k]. The overpotential $V_2[0]$ at the time point when the event occurred may be 0 V(volt).

The following Equation 4 is a first state equation associated with the time update process of the extended Kalman filter, and is derived from a combination of Equation 2 and Equation 3.

$$\hat{x}_{k+1}^- = \begin{pmatrix} SOC[k+1] \\ V_2[k+1] \end{pmatrix} = A\hat{x}_k + Bi[k+1] \quad \langle\text{Equation 4}\rangle$$

$$\hat{x}_k = \begin{pmatrix} SOC_e[k] \\ V_2[k] \end{pmatrix}$$

$$A = \begin{pmatrix} 1 & 0 \\ 0 & e^{-\frac{\Delta t}{\tau[k+1]}} \end{pmatrix}$$

$$B = \begin{pmatrix} \frac{\Delta t}{Q_{est}} \\ R_2[k+1]\left(1 - e^{-\frac{\Delta t}{\tau[k+1]}}\right) \end{pmatrix}$$

In Equation 4 and the following Equations 5 to 8, the superscripted symbol ^ indicates a value estimated by time updates. Additionally, the superscripted symbol ⁻ indicates a value before correction by measurement updates described below.

The following Equation 5 is a second state equation associated with the time update process of the extended Kalman filter.

$$P_{k+1}^- = AP_kA^T + Q_k \quad \langle\text{Equation 5}\rangle$$

$$Q_k = \begin{pmatrix} W1_k & 0 \\ 0 & W2_k \end{pmatrix}$$

In Equation 5, $P_k$ denotes an error covariance matrix corrected in the previous cycle, $Q_k$ denotes a process noise covariance matrix in the previous cycle, T denotes a transpose operator, and P-k+1 denotes an error covariance matrix in the current cycle. In k=0, $P_0$ may be equal to [1 0; 0 1]. $W1_k$ is first process noise set in the previous cycle, and is associated with reliability of the ampere counting. That is, $W1_k$ is a positive number indicating inaccuracy of the cumulative current value calculated using the ampere counting. $W2_k$ is second process noise set in the previous cycle, and is associated with reliability of the equivalent circuit model 200. That is, $W2_k$ is a positive number indicating inaccuracy of the parameters associated with the equivalent circuit model 200. Accordingly, the control unit 120 may increase the first process noise as the inaccuracy of the ampere counting increases. The control unit 120 may increase the second process noise as the inaccuracy of the equivalent circuit model 200 increases.

When the time update process using Equation 4 and Equation 5 is completed, the control unit 120 performs a measurement update process.

The following Equation 6 is a first observation equation associated with the measurement update process of the extended Kalman filter.

$$K_{k+1} = P_{k+1}^- H_{k+1}^T \left(H_{k+1} P_{k+1}^- H_{k+1}^T + R\right)^{-1} \quad \langle\text{Equation 6}\rangle$$

$$H_{k+1}^T = \begin{pmatrix} \frac{f_1(SOC[k+1]+0.01n) - f_1(SOC[k+1]-0.01n)}{2n} \\ 1 \end{pmatrix}$$

In Equation 6, $K_{k+1}$ denotes a Kalman gain in the current cycle. Additionally, R is a measurement noise covariance matrix, and has preset components. $H_{k+1}$ is a system matrix, and is used to reflect changes in OCV of the battery 20 according to the OCV-SOC curve when estimating the SOC of the battery 20. n is a preset positive integer (e.g., 1).

The following Equation 7 is a second observation equation associated with the measurement update process of the extended Kalman filter.

$$\hat{x}_{k+1} = \hat{x}_{k+1}^- + K_{k+1}\{z_{k+1} - V_{ecm}[k+1]\} \quad \langle\text{Equation 7}\rangle$$

$$= \hat{x}_{k+1}^- + K_{k+1}\{z_{k+1} - (f_1(SOC[k+1]) + V_1[k+1] + V_2[k+1])\}$$

In Equation 7, $z_{k+1}$ denotes the voltage of the battery 20 measured in the current cycle, and $V_{ecm}[k+1]$ denotes the output voltage of the equivalent circuit model 200 in the current cycle. $f_1(SOC[k+1])$ denotes the OCV in the current cycle (see the description of FIG. 2). $V_1[k+1]$ denotes the voltage across the ohm resistor $R_1$ in the current cycle, and may equal the multiplication of one of τ[k+1] and τ[k] by $R_1[k+1]$. $R_1[k+1]$ is the resistance value of the ohm resistor $R_1$ in the current cycle. The control unit 120 may determine $R_1[k+1]$ based on the first temperature value and the SOC determined in the previous cycle. To this end, a first lookup table defining a correspondence relationship between the SOC, the temperature value and the resistance value of the ohm resistor $R_1$ is recored in the memory unit 130. The control unit 120 may obtain a resistance value mapped to a specific temperature value (e.g., the first temperature value) and a specific SOC from the first lookup table using the specific temperature value and the specific SOC as an index. Each of SOC[k+1] and $V_2[k+1]$ obtained from Equation 4 is corrected by Equation 7.

The following Equation 8 is a third observation equation associated with the measurement update process of the extended Kalman filter.

$$P_{k+1} = (E - K_{k+1}H_{k+1})P_{k+1}^- \quad <\text{Equation 8}>$$

In Equation 8, E denotes the unit matrix. P-k+₁ obtained from Equation 5 is corrected to $P_{k+1}$ by Equation 8.

The control unit 120 periodically updates the SOC of the battery 20 in the current cycle by performing each calculation step of Equations 4 to 8 at least once each time the time index k increases by 1.

Hereinafter, the operation of determining the second candidate value and the third candidate value will be described with reference to the above description of the extended Kalman filter.

The control unit 120 determines the second candidate value based on the first data set. As described previously, the first data set includes the first current value, the first voltage value and the first temperature value. The control unit 120 determines $R_2[k+1]$ and $\tau[k+1]$ of Equation 4 based on the first temperature value and the SOC determined in the previous cycle.

To this end, the memory unit 130 may record a second lookup table defining a correspondence relationship between the SOC, the temperature value and the resistance value of the resistor $R_2$. The control unit 120 may obtain the resistance value mapped to the first temperature value and the SOC determined in the previous cycle as $R_2[k+1]$ of Equation 4 from the second lookup table using the first temperature value and the SOC determined in the previous cycle as an index. Additionally, the memory unit 130 may record a third lookup table defining a correspondence relationship between the SOC, the temperature value and the time constant. The control unit 120 may obtain the time constant mapped to the first temperature value and the SOC determined in the previous cycle as a first time constant from the third lookup table using the first temperature value and the SOC determined in the previous cycle as an index. The control unit 120 may set a value obtained by adding the first time constant to a correction value determined in the previous cycle as $\tau[k+1]$ of Equation 4. When k=0, a predetermined initial value (e.g., 0) may be used as the correction value. The determination of the correction value will be described below.

The control unit 120 sets $\tau[k+1]$ (or $\tau[k]$) of Equation 4 to be equal to the first current value and $z_{k+1}$ of Equation 7 to be equal to the first voltage value. Accordingly, the control unit 120 may determine SOC[k+1] corrected by Equation 7 as the second candidate value.

The control unit 120 converts the first data set to a second data set, and determines the third candidate value based on the second data set. In detail, the control unit 120 may generate the second data set from the first data set using an error generator. The error generator is operated by the control unit 120 to forcibly change at least one of the first current value, the first voltage value and the first temperature value included in the first data set in consideration of external noise or detection accuracy of the sensing unit 110. The second data set includes a second current value, a second voltage value and a second temperature value. That is, the error generator may be a predetermined function coded to selectively make at least one of a change from the first current value to the second current value, a change from the first voltage value to the second voltage value and a change from the first temperature value to the second temperature value. For example, second current value=(first current value×$X_1$)+$X_2$, second voltage value=(first voltage value×$X_3$)+$X_4$, and second temperature value=(first temperature value×$X_5$)+$X_6$. $X_1$ to $X_6$ may be constants that are preset to be the same or different from one another.

The two values included in each of at least one of a pair of the first current value and the second current value, a pair of the first voltage value and the second voltage value and a pair of the first temperature value and the second temperature value are different from each other. In an example, the first current value and the second current value may be equal to each other, while the first voltage value and the second voltage value may be different from each other, and the first temperature value and the second temperature value may be also different from each other. In another example, the first current value and the second current value may be different from each other, the first voltage value and the second voltage value may be different from each other, and the first temperature value and the second temperature value may be also different from each other.

When the second data set is generated, the control unit 120 may determine $R_2[k+1]$ and $\tau[k+1]$ of Equation 4 based on the second temperature value and the SOC determined in the previous cycle.

In detail, the control unit 120 may obtain the resistance value mapped to the second temperature value and the SOC determined in the previous cycle as $R_2[k+1]$ of Equation 4 from the second lookup table. The control unit 120 may obtain a second time constant mapped to the second temperature value and the SOC determined in the previous cycle from the third lookup table. The control unit 120 may set a value obtained by adding the second time constant to the correction value as $\tau[k+1]$ of Equation 4.

The control unit 120 sets $\tau[k+1]$ (or $\tau[k]$) of Equation 4 to be equal to the second current value instead of the first current value. Additionally, the control unit 120 sets $z_{k+1}$ of Equation 7 to be equal to the second voltage value instead of the first voltage value. Accordingly, the control unit 120 may determine SOC[k+1] corrected by Equation 7 as the third candidate value.

When the determination of the first candidate value, the second candidate value and the third candidate value for the SOC of the battery 20 is completed in the current cycle, the control unit 120 is configured to select any one of the first candidate value and the second candidate value, and determine the selected candidate value as the SOC in the current cycle through a process described below.

The control unit 120 determines a first difference value that is an absolute value of a difference between the first candidate value and the second candidate value. In an example, when the first candidate value is 0.51 and the second candidate value is 0.52, the first difference value is 0.01. In another example, when the first candidate value is 0.77 and the second candidate value is 0.75, the first difference value is 0.02.

The control unit 120 determines a second difference value that is an absolute value of a difference between the first candidate value and the third candidate value. In an example, when the first candidate value is 0.61 and the third candidate value is 0.64, the second difference value is 0.03. In another example, when the first candidate value is 0.38 and the second candidate value is 0.36, the second difference value is 0.02.

The control unit 120 may compare the first difference value with a predetermined threshold value. The threshold value is stored in the memory unit 130, and may be, for example, 0.03.

When the first difference value is larger than the threshold value, the control unit 120 may determine the first candidate value as the SOC of the battery 20.

When the first difference value is equal to or smaller than the threshold value, the control unit 120 determines the second candidate value rather than the first candidate value as the SOC of the battery 20.

The control unit 120 may compare the first difference value with the second difference value. When the second difference value is equal to or larger than the first difference value, the control unit 120 may set a ratio of the second process noise to the first process noise to be equal to a predetermined reference ratio (e.g., 0.1). For example, the first process noise may be set to be equal to a predetermined first reference value (e.g., 0.1), and the second process noise may be set to be equal to a predetermined second reference value (e.g., 0.01). That is, the reference ratio may be equal to a value obtained by dividing the second reference value by the first reference value.

When the second difference value is equal to or larger than the first difference value, the control unit 120 may set the correction value to be equal to the initial value. The control unit 120 may store the correction value set to be equal to the initial value in the memory unit 130.

Meanwhile, referring to Equation 2 about the ampere counting, the first candidate value only relies on the current among the current, the voltage and temperature of the battery 20. On the other hand, referring to Equations 3 to 8 about the extended Kalman filter, the second candidate value may rely on the current of the battery 20 as well as the voltage and temperature of the battery 20. When considering this, it can be seen that as inaccuracy of the equivalent circuit model 200 is higher, there is a higher possibility that the second difference value will be smaller than the first difference value.

Accordingly, when the second difference value is smaller than the first difference value, the control unit 120 may increase the ratio of the second process noise to the first process noise above the reference ratio. In an example, the first process noise may be set as a value (e.g., 0.07) that is smaller than the first reference value, and the second process noise may be set to be equal to the second reference value. In another example, the first process noise may be set to be equal to the first reference value, and the second process noise may be set as a value (e.g., 0.02) that is larger than the second reference value. In still another example, the first process noise may be set as a value that is smaller than the first reference value, and the second process noise may be set as a value that is larger than the second reference value.

When the second difference value is smaller than the first difference value, the control unit 120 may determine the ratio of the second process noise to the first process noise in proportion to the first difference value. In an example, when the first difference value is 0.01, the control unit 120 may determine the ratio of the second process noise to the first process noise to be 0.11, when the first difference value is 0.013, the control unit 120 may determine the ratio of the second process noise to the first process noise to be 0.112, and when the first difference value is 0.008, the control unit 120 may determine the ratio of the second process noise to the first process noise to be 0.103.

Alternatively, when the second difference value is smaller than the first difference value, the control unit 120 may determine the ratio of the second process noise to the first process noise in proportion to the absolute value of a difference between the first difference value and the second difference value.

The first process noise and the second process noise set as described above may be respectively allocated to $W1_k$ and $W2_k$ of Equation 5 in the process of estimating the SOC in the next cycle. Accordingly, when the extended Kalman filter is performed in the next cycle, reliability (i.e., influence) for the equivalent circuit model 200 temporarily decreases, and reliability for the ampere counting temporarily increases.

When the second difference value is smaller than the first difference value, the control unit 120 may update the correction value to a value that is larger than the initial value. The control unit 120 may store the updated correction value in the memory unit 130.

When the second difference value is smaller than the first difference value, the control unit 120 may determine the updated correction value such that a difference between the updated correction value and the initial value is proportional to the first difference value. For example, when the first difference value is 0.01, the updated correction value may be determined to be larger than the initial value by 5, and when the first difference value is 0.013, the updated correction value may be determined to be larger than the initial value by 6.

Alternatively, when the second difference value is smaller than the first difference value, the control unit 120 may determine the updated correction value such that a difference between the updated correction value and the initial value is proportional to the difference between the first difference value and the second difference value. For example, when the first difference value is larger than the second difference value by 0.01, the updated correction value may be determined to be larger than the initial value by 4, and when the first difference value is larger than the second difference value by 0.013, the updated correction value may be determined to be larger than the initial value by 4.5.

Alternatively, when the second difference value is smaller than the first difference value, the control unit 120 may update the correction value using the following Equation 9.

$$E_{correct} = \frac{M_1(D_1 - D_2) + M_2 D_1}{M_1 + M_2} \quad \langle \text{Equation 9} \rangle$$

In Equation 9, $D_1$ denotes the first difference value, $D_2$ denotes the second difference value, $M_1$ denotes a first weight, $M_2$ denotes a second weight, and $E_{correct}$ denotes the updated correction value. Each of $M_1$ and $M_2$ may be a preset positive number, and they may be the same or different from each other.

The correction value updated as described above may be stored in the memory unit 130, and may be added to each of the first time constant and the second time constant that will be obtained in the next cycle in the process of estimating the SOC for the next cycle.

In detail, in the process of determining the second candidate value based on the first data set in the next cycle, the sum of the updated correction value and the first time constant in the next cycle may be allocated to $\tau[k+1]$ of Equation 4. Additionally, in the process of determining the third candidate value based on the second data set in the next cycle, the sum of the updated correction value and the second time constant in the next cycle may be allocated to $\tau[k+1]$ of Equation 4.

As described previously, as the time constant of the RC pair 220 is larger, the current sensitivity of the equivalent circuit model 200 is lower. When the extended Kalman filter is performed in the next cycle, $\tau[k+1]$ of Equation 4 increases by a difference between the updated correction value and the initial value, and thus reliability (i.e., influence) of the equivalent circuit model 200 temporarily decreases, and reliability of the ampere counting temporarily increases.

The control unit 120 may selectively output the switching signal SS to control the switch 30. When the second difference value is smaller than the first difference value, the control unit 120 may regulate the duty cycle of the switching signal SS below a predetermined reference duty cycle (e.g., 0.2). When the duty cycle of the switching signal SS is regulated below the reference duty cycle, the maximum amount of currents that can flow through the battery 20 reduces, thereby avoiding rapid changes in voltage and temperature of the battery 20.

Figure 4:
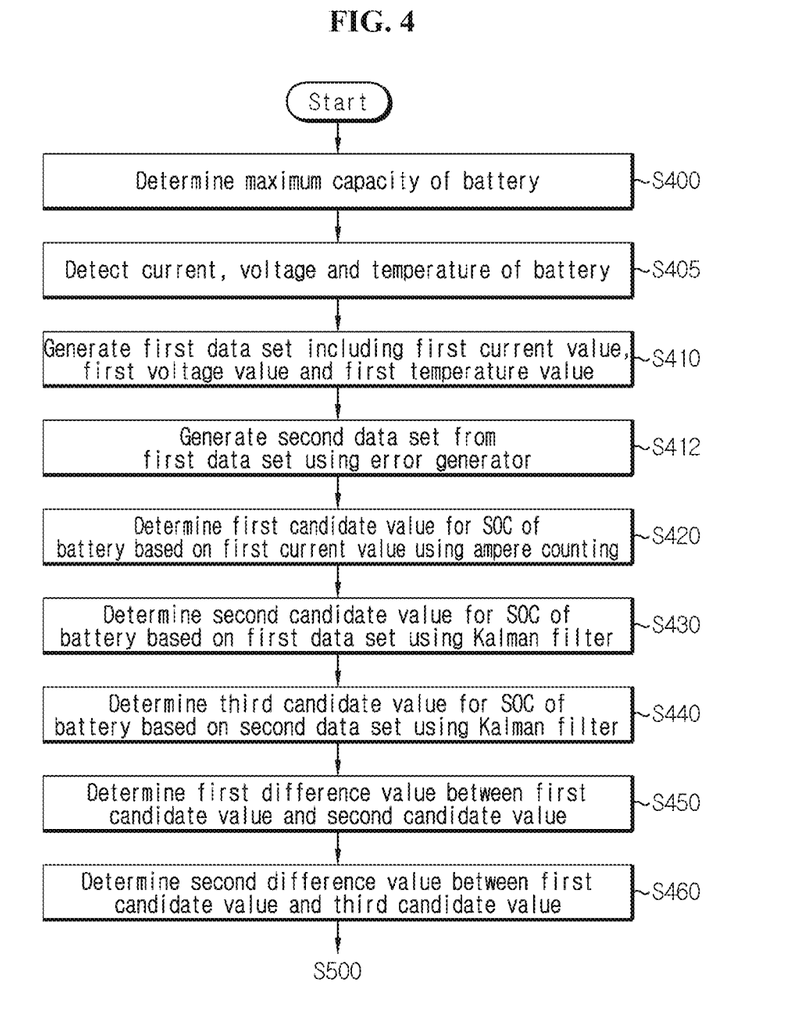
FIGS. 4 and 5 are exemplary flowcharts of a battery management method according to a first embodiment of the present disclosure.
Figure 5:
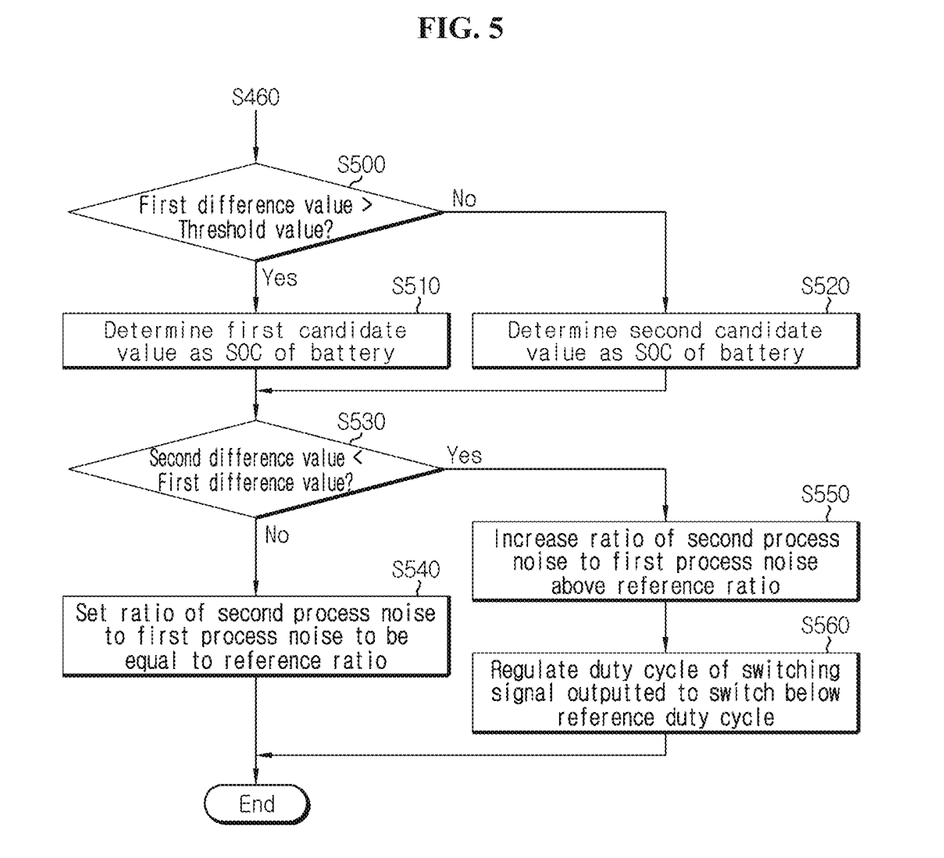

FIGS. 4 and 5 are exemplary flowcharts of a battery management method according to a first embodiment of the present disclosure. The method of FIGS. 4 and 5 may be periodically performed from the time point at which an event occurred. The method of FIGS. 4 and 5 may end when charging/discharging of the battery 20 is stopped.

Referring to FIGS. 1 to 5, in step S400, the control unit 120 determines the maximum capacity (or SOH) of the battery 20 (see Equation 1).

In step S405, the control unit 120 detects the current, voltage and temperature of the battery 20 using the sensing unit 110. The sensing unit 110 outputs a signal SI indicating the detected current, a signal SV indicating the detected voltage and a signal ST indicating the detected temperature to the control unit 120.

In step S410, the control unit 120 receives the signal SI, the signal SV and the signal ST, and generates a first data set including a first current value indicating the current of the battery 20, a first voltage value indicating the voltage of the battery 20 and a first temperature value indicating the temperature of the battery 20.

In step S412, the control unit 120 generates a second data set from the first data set using an error generator. The second data set includes a second current value, a second voltage value and a second temperature value.

In step S420, the control unit 120 determines a first candidate value for the SOC of the battery 20 based on the first current value using ampere counting (see Equation 2).

In step S430, the control unit 120 determines a second candidate value for the SOC of the battery 20 based on the first data set using the extended Kalman filter (see Equations 3 to 8).

In step S440, the control unit 120 determines a third candidate value for the SOC of the battery 20 based on the second data set using the extended Kalman filter (see Equations 3 to 8). As opposed to that of FIG. 4, any two or all of the steps S420, S430 and S440 may be performed at the same time. The sequence of the steps S420, S430 and S440 may be changed where necessary.

In step S450, the control unit 120 determines a first difference value between the first candidate value and the second candidate value.

In step S460, the control unit 120 determines a second difference value between the first candidate value and the third candidate value. As opposed to that of FIG. 4, the steps S450 and S460 may be performed at the same time. The sequence of the steps S450 and S460 may be changed where necessary.

In step S500, the control unit 120 determines if the first difference value is larger than the threshold value. When a value of the step S500 is "YES", step S510 is performed. When the value of the step S500 is "NO", step S520 is performed.

In step S510, the control unit 120 determines the first candidate value as the SOC of the battery 20.

In step S520, the control unit 120 determines the second candidate value as the SOC of the battery 20.

In step S530, the control unit 120 determines if the second difference value is smaller than the first difference value. When a value of the step S530 is "NO", step S540 is performed. When the value of the step S530 is "YES", at least one of steps S550 and S560 is performed.

In step S540, the control unit 120 sets a ratio of second process noise to first process noise to be equal to the reference ratio. For example, the first process noise may be set to be equal to the first reference value, and the second process noise may be set to be equal to the second reference value. The reference ratio is a value obtained by dividing the second reference value by the first reference value.

In step S550, the control unit 120 increases the ratio of the second process noise to the first process noise above the reference ratio.

In step S560, the control unit 120 regulates the duty cycle of the switching signal SS outputted to the switch 30 below the reference duty cycle. A difference between the regulated duty cycle and the reference duty cycle may be proportional to a difference between the first difference value and the second difference value.

Figure 6:
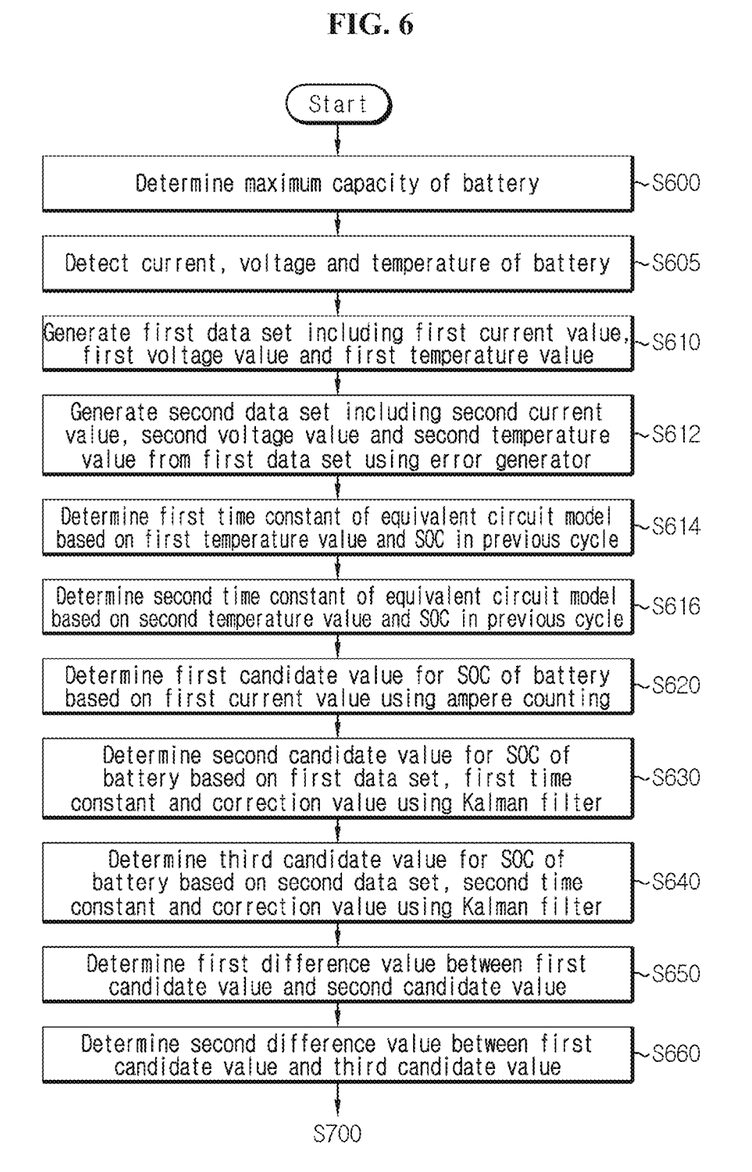
FIGS. 6 and 7 are exemplary flowcharts of a battery management method according to a second embodiment of the present disclosure.
Figure 7:
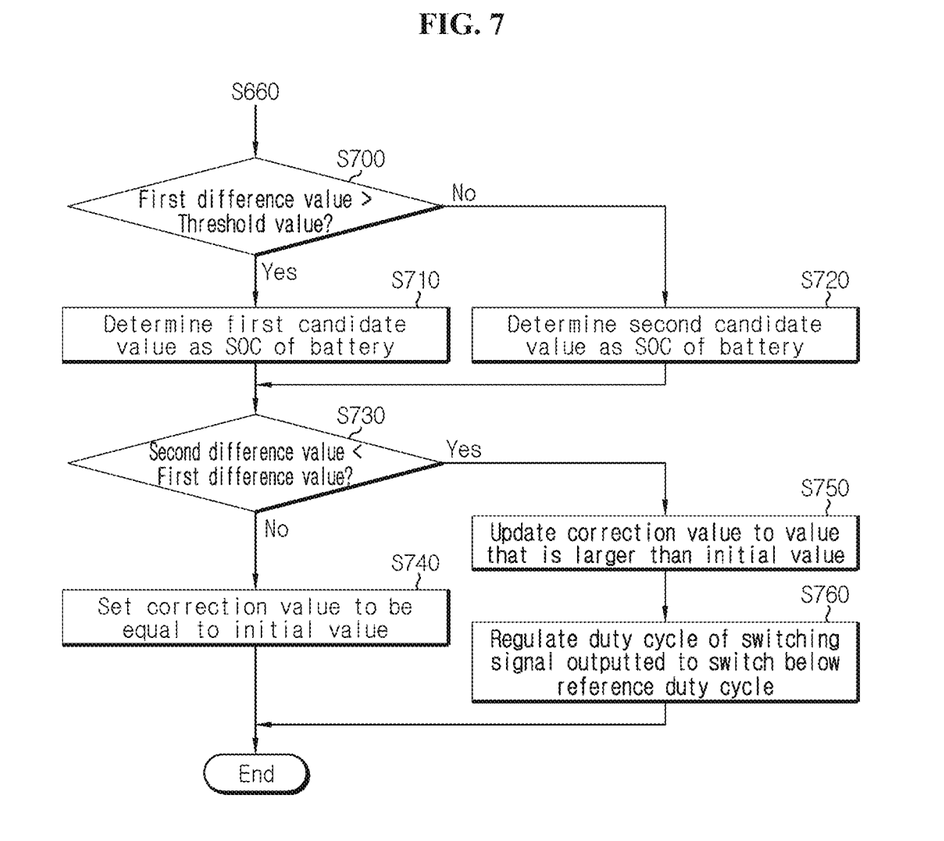

FIGS. 6 and 7 are exemplary flowcharts of a battery management method according to a second embodiment of the present disclosure. The method of FIGS. 6 and 7 may be performed periodically from the time point at which an event occurred. The method of FIGS. 6 and 7 may end when charging/discharging of the battery 20 is stopped.

Referring to FIGS. 1 to 3, 6 and 7, in step S600, the control unit 120 determines the maximum capacity (or SOH) of the battery 20 (see Equation 1).

In step S605, the control unit 120 detects the current, voltage and temperature of the battery 20 using the sensing unit 110. The sensing unit 110 outputs a signal SI indicating the detected current, a signal SV indicating the detected voltage and a signal ST indicating the detected temperature to the control unit 120.

In step S610, the control unit 120 receives the signal SI, the signal SV and the signal ST, and generates a first data set including a first current value indicating the current of the battery 20, a first voltage value indicating the voltage of the battery 20 and a first temperature value indicating the temperature of the battery 20.

In step S612, the control unit 120 generates a second data set from the first data set using an error generator. The second data set includes a second current value, a second voltage value and a second temperature value.

In step S614, the control unit 120 determines a first time constant of the equivalent circuit model 200 based on the first temperature value and the SOC in the previous cycle.

In step S616, the control unit 120 determines a second time constant of the equivalent circuit model 200 based on the second temperature value and the SOC in the previous cycle. As described above, each of the first time constant in the step S614 and the second time constant in the step S616 may be obtained from the third lookup table. As opposed to that of FIG. 6, the steps S614 and S616 may be performed at the same time, or the step S616 may precede the step S614.

In step S620, the control unit 120 determines a first candidate value for the SOC of the battery 20 based on the first current value using ampere counting (see Equation 2).

In step S630, the control unit 120 determines a second candidate value for the SOC of the battery 20 based on the first data set, the first time constant and the correction value using the extended Kalman filter (see Equations 3 to 8).

In step S640, the control unit 120 determines a third candidate value for the SOC of the battery 20 based on the second data set, the second time constant and the correction value using the extended Kalman filter (see Equations 3 to 8). As opposed to that of FIG. 6, any two or all of the steps S620, S630 and S640 may be performed at the same time. The sequence of the steps S620, S630 and S640 may be changed where necessary.

In step S650, the control unit 120 determines a first difference value between the first candidate value and the second candidate value.

In step S660, the control unit 120 determines a second difference value between the first candidate value and the third candidate value. As opposed to that of FIG. 6, the steps S650 and S660 may be performed at the same time, or the step S660 may precede the step S650.

In step S700, the control unit 120 determines if the first difference value is larger than the threshold value. When a value of the step S700 is "YES", step S710 is performed. When the value of the step S700 is "NO", step S720 is performed.

In step S710, the control unit 120 determines the first candidate value as the SOC of the battery 20.

In step S720, the control unit 120 determines the second candidate value as the SOC of the battery 20.

In step S730, the control unit 120 determines if the second difference value is smaller than the first difference value. When the value of the step S730 is "NO", step S740 is performed. When the value of the step S730 is "YES", at least one of steps S750 and S760 is performed.

In step S740, the control unit 120 sets the correction value to be equal to the initial value.

In step S750, the control unit 120 updates the correction value to a value that is larger than the initial value (see Equation 9). The correction value updated in the step S750 may be used to determine the second candidate value and the third candidate value when the steps S630 and S640 are performed in the next cycle.

In step S760, the control unit 120 regulates the duty cycle of the switching signal SS outputted to the switch 30 below the reference duty cycle. A difference between the regulated duty cycle and the reference duty cycle may be proportional to a difference between the first difference value and the second difference value.

Although the battery management method of FIGS. 4 and 5 and the battery management method of FIGS. 6 and 7 are separately described, when a certain step of any one of the two battery management methods is performed, a certain step of the other battery management method may be performed together. In an example, when the step S740 is performed, the step S540 may be performed together. In another example, when the step S750 is performed, the step S550 may be performed together.

The embodiments of the present disclosure described hereinabove are not implemented only through the apparatus and method, and may be implemented through programs that perform functions corresponding to the configurations of the embodiments of the present disclosure or recording media having the programs recorded thereon, and such implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and some or all of the embodiments may be selectively combined to allow various modifications.

What is claimed is:

1. A battery management apparatus, comprising:
a sensing unit configured to detect a current, a voltage, and a temperature of a battery; and
a control unit configured to:
generate a first data set including:
a first current value indicating the detected current;
a first voltage value indicating the detected voltage; and
a first temperature value indicating the detected temperature;
generate a second data set including a second current value, a second voltage value and a second temperature value from the first data set using an error generator;
determine a first time constant of an equivalent circuit model of an extended Kalman filter based on the first temperature value and a state of charge (SOC) in a previous cycle;
determine a second time constant of the equivalent circuit model based on the second temperature value and the SOC in the previous cycle;
determine a first candidate value for the SOC of the battery based on the first current value using ampere counting;
determine a second candidate value for the SOC, based on the first data set, the first time constant, and a correction value, using the extended Kalman filter;
determine a third candidate value for the SOC, based on the second data set, the second time constant, and the correction value, using the extended Kalman filter;
determine a first difference value between the first candidate value and the second candidate value;
determine a second difference value between the first candidate value and the third candidate value; and
update the correction value when the second difference value is smaller than the first difference value,
wherein the updated correction value is larger than a predetermined initial value.

2. The battery management apparatus according to claim 1, wherein the two values included in each of at least one of a first pair of the first current value and the second current value, a second pair of the first voltage value and the second voltage value, and a third pair of the first temperature value and the second temperature value are different from each other.

3. The battery management apparatus according to claim 1, wherein a difference between the updated correction value and the initial value is proportional to the first difference value.

4. The battery management apparatus according to claim 1, wherein the difference between the updated correction value and the initial value is proportional to a difference between the first difference value and the second difference value.

5. The battery management apparatus according to claim 1, wherein the control unit is further configured to update the correction value using the following equation:

$$E_{correct} = \frac{M_1(D_1 - D_2) + M_2 D_1}{M_1 + M_2}$$

where:
$D_1$ denotes the first difference value,
$D_2$ denotes the second difference value,
$M_1$ denotes a first weight,
$M_2$ denotes a second weight, and
$E_{correct}$ denotes the updated correction value.

6. The battery management apparatus according to claim 1, wherein the control unit is further configured to update the correction value to be equal to the initial value, when the second difference value is equal to or larger than the first difference value.

7. The battery management apparatus according to claim 1, wherein the control unit is further configured to determine the first candidate value as the SOC, when the first difference value is larger than a threshold value.

8. The battery management apparatus according to claim 7, wherein the control unit is further configured to determine the second candidate value as the SOC, when the first difference value is equal to or smaller than the threshold value.

9. The battery management apparatus according to claim 1, wherein the control unit is further configured to:
selectively output a switching signal for controlling a switch installed on a current path of the battery, and
regulate a duty cycle of the switching signal below a reference duty cycle, when the second difference value is smaller than the first difference value.

10. A battery pack comprising the battery management apparatus according to claim 1.

11. The battery management apparatus according to claim 1, wherein the control unit is further configured to:
store the updated correction value in a memory; and
add the updated correction value to each of the first time constant and the second time constant.

12. The battery management method according to claim 1, further comprising:
storing the updated correction value in a memory; and
adding the updated correction value to each of the first time constant and the second time constant.

13. A battery management method, comprising:
detecting a current, a voltage, and a temperature of a battery;
generating a first data set including:
a first current value indicating the detected current,
a first voltage value indicating the detected voltage; and
a first temperature value indicating the detected temperature;
generating a second data set, including a second current value, a second voltage value, and a second temperature value from the first data set, using an error generator;
determining a first time constant of an equivalent circuit model of an extended Kalman filter based on the first temperature value and a state of charge (SOC) in a previous cycle;
determining a second time constant of the equivalent circuit model based on the second temperature value and the SOC in the previous cycle;
determining a first candidate value for the SOC of the battery, based on the first current value, using ampere counting;
determining a second candidate value for the SOC, based on the first data set, the first time constant, and a correction value, using the extended Kalman filter;
determining a third candidate value for the SOC, based on the second data set, the second time constant, and the correction value, using the extended Kalman filter;
determining a first difference value between the first candidate value and the second candidate value;
determining a second difference value between the first candidate value and the third candidate value; and
updating the correction value when the second difference value is smaller than the first difference value,
wherein the updated correction value is larger than a predetermined initial value.

14. The battery management method according to claim 13, wherein a difference between the updated correction value and the initial value is proportional to the first difference value.

15. The battery management method according to claim 13, further comprising:
determining the first candidate value as the SOC, when the first difference value is larger than a threshold value; and
determining the second candidate value as the SOC, when the first difference value is equal to or smaller than the threshold value.

16. The battery management method according to claim 13, wherein a difference between the updated correction value and the initial value is proportional to a difference between the first difference value and the second difference value.

17. The battery management method according to claim 13, wherein the two values included in each of at least one of a first pair of the first current value and the second current value, a second pair of the first voltage value and the second voltage value, and a third pair of the first temperature value and the second temperature value are different from each other.

18. The battery management method according to claim 13, further comprising updating the correction value using the following equation:

$$E_{correct} = \frac{M_1(D_1 - D_2) + M_2 D_1}{M_1 + M_2}$$

where:
$D_1$ denotes the first difference value,
$D_2$ denotes the second difference value,
$M_1$ denotes a first weight,
$M_2$ denotes a second weight, and
$E_{correct}$ denotes the updated correction value.

19. The battery management method according to claim 13, further comprising updating the correction value to be equal to the initial value, when the second difference value is equal to or larger than the first difference value.

20. The battery management method according to claim 13, further comprising:
selectively outputting a switching signal for controlling a switch installed on a current path of the battery; and
regulating a duty cycle of the switching signal below a reference duty cycle, when the second difference value is smaller than the first difference value.

* * * * *